United States Patent [19]

Nagasawa et al.

[11] Patent Number: 5,068,856
[45] Date of Patent: Nov. 26, 1991

[54] METHOD AND CIRCUIT FOR DETECTING DATA ERROR

[75] Inventors: Naobumi Nagasawa; Hiroyuki Arai, both of Gunma, Japan

[73] Assignee: Sanyo Electric Co., Ltd., Moriguchi, Japan

[21] Appl. No.: 339,758

[22] Filed: Apr. 18, 1989

[51] Int. Cl.$^5$ .......................................... G06F 11/10
[52] U.S. Cl. ................................ 371/37.5; 371/37.1
[58] Field of Search ................... 371/37.5, 37.4, 37.1, 371/37.2, 38.1, 39.1, 40.1

[56] References Cited

U.S. PATENT DOCUMENTS

| | | | |
|---|---|---|---|
| 4,637,021 | 1/1987 | Shenton | 371/37.5 |
| 4,852,099 | 7/1989 | Ozaki | 371/37.5 |
| 4,868,827 | 9/1989 | Yamada | 371/37.5 |

Primary Examiner—Jerry Smith
Assistant Examiner—Robert W. Beausoliel
Attorney, Agent, or Firm—Stanger, Michaelson, Spivak & Wallace

[57] ABSTRACT

An error detecting circuit includes syndrome calculating circuits which calculates quotients $S_0'$, $S_1'$, $S_2'$ and $S_3'$ by division of syndromes. When all of the syndromes are "0", an error zero is detected by an error zero detecting circuit, and a signal is outputted. A single error detecting circuit detects a single error when $S_0'=S_1'=S_2'=S_3'\neq 0$, outputting a signal. At this time, a J-latch holds a counted value "j" of the counter which counts the number of the division as data indicative of an error position. Based upon data calculated by adding circuits and multiplying circuits, a double error detecting circuit detects that there are two or more errors through determination whether or not equations $(S_0'+S_1')(S_2'+S_3')=(S_1'+S_2')^2$ and $(S_0'+S_2')(S_2'+S_3')=(S_1'+S_2')(S_1'+S_3')$ can be formed, outputting a detection signal when double errors occur. At this time, the J-latch and an i-latch hold counted values "j" and "i" as data indicative of error positions. By an error component calculating circuit, error components $E_i$ and $E_j$ are calculated by $(S_0'+S_1')/(1+\alpha^{i-j})$ and $S_0-E_i$, respectively because a syndrome $S_0=E_i+E_j$.

7 Claims, 6 Drawing Sheets

METHOD AND CIRCUIT FOR DETECTING DATA ERROR

BACKGROUND OF THE INVENTION

1. Field of the invention

The present invention relates to a method and circuit for detecting a data error. More specifically, the present invention relates to a data error detecting circuit incorporated in a signal processing circuit which is used in a compact disc (CD) player.

2. Description of the prior art

In a CD player, an 8-bit symbol is produced based upon data which is read from a disc in the form of an EFM signal such that music signal data can be reproduced; however, there is possibility that a data error occurs in the symbol. Such a data error originates in a defect which takes place when pits are written on the disc, a defect due to a wound which takes place in handling the disc, or a defect due to fluctuation or disturbance of a mechanical characteristic of the player. Therefore, in the CD player, in order to detect and correct such a data error, a system called a Cross Interleave Reed-Solomon Code (CIRC) is utilized.

For better understanding of the present invention, the system is described in outline. First, in the case where the data is recorded on the disc, right channel data and left channel data each including 16-bit music signal data of 6 in total are divided into 8-bit symbols, and therefore, 24 symbols in total are produced. After selectively delaying and re-composing these symbols, parity data $Q_0$, $Q_1$, $Q_2$ and $Q_3$ (each being 8 bits) of $C_2$ are added to the symbols in accordance with a Reed-Solomon Code method, becoming 28 symbols in total. The 28 symbols are further delayed by a time period different from each other, respectively, and parity data $P_0$, $P_1$, $P_2$ and $P_3$ (each being 8 bits) of $C_1$ are also added to the 28 symbols in accordance with the Reed-Solomon Code method, becoming 32 symbols in total. Then, the 32 symbols are selectively delayed and the parity data $Q_0$, $Q_1$, $Q_2$ and $Q_3$, and $P_0$, $P_1$, $P_2$ and $P_3$ are inverted such that the symbols become a group of data to be written, and thereafter, such a group of data are modulated in a form of an EFM (Eight to Fourteen Modulation) and recorded on the disc together with synchronization signals.

In reproducing the disc, the 8-bit symbols of 32 in total are produced from an EFM signal which is read from the disc, such symbols are conducted in the reverse process of the above described writing process. More specifically, the 32 symbols are selectively delayed and the parity data $Q_0$, $Q_1$, $Q_2$ and $Q_3$, and $P_0$, $P_1$, $P_2$ and $P_3$ are inverted, and thereafter, the symbols are $C_1$-decoded, becoming 28 symbols in total. In $C_1$-decoding process, a syndrome is calculated based upon the respective symbols, and error detection and correction is made based upon such a calculated syndrome in accordance with the Reed-Solomon Code method. Furthermore, the 28 symbols being $C_1$-decoded are $C_2$-decoded after selectively delaying the same, becoming 24 symbols in total. As similar to the $C_1$-decoding process, in the $C_2$-decoding process, a syndrome is calculated based upon the respective symbols, and error detection and correction is made based upon such a calculated syndrome in accordance with the Reed-Solomon Code method. Then, the 24 symbols after $C_2$-decoding process are re-composed and selectively delayed, being restored to the original music signal data.

In addition, the CD system which utilizes a Cross Interleave Reed-Solomon Code method has been well known, and therefore, a more detailed description will be omitted here.

Conventionally, in the case where a data error is to be detected in accordance with the Reed-Solomon Code method, syndromes are calculated in accordance with the following equation (1).

$$\begin{bmatrix} S_0 \\ S_1 \\ S_2 \\ S_3 \end{bmatrix} = \begin{bmatrix} 1 & 1 & \ldots & 1_1 \\ \alpha^{31} & \alpha^{30} & \ldots & \alpha_1 \\ \alpha^{52} & \alpha^{50} & \ldots & \alpha^2_1 \\ \alpha^{93} & \alpha^{90} & \ldots & \alpha^{31} \end{bmatrix} \begin{bmatrix} D_0 \\ D_1 \\ \vdots \\ D_{31} \end{bmatrix} \quad (1)$$

where, $\alpha$ is a root of a polynomial of degree eight as follows:

$$F(X) = X^8 + X^4 + X^3 + X^2 + 1$$

As a result of the above described calculation, if all of the syndromes $S_0$, $S_1$, $S_2$ and $S_3$ are "0", it is detected that no errors occur, that is, error zero.

On the other hand, in the case where a data error occurs in only the j-th data $D_j$, such a data error can be detected by determining whether or not relationship set forth in the following can be formed:

$$S_1^2 = S_0 \cdot S_2, \quad S_2^2 = S_1 \cdot S_3$$

$$S_0 \neq 0, \, S_1 \neq 0, \, S_2 \neq = 0, \, S_3 \neq 0$$

and, a position where the data error occurs (error position) can be evaluated by calculating $S_1/S_0 = \alpha^j$ and a logarithm thereof.

Furthermore, in the case where data errors occur in the data $D_j$ and $D_i$, since the following equations can be formed, by evaluating j and i, it is possible to detect that data errors occur.

$$\alpha^j + \alpha^i = (S_1 \cdot S_2 + S_0 \cdot S_3)/(S_1^2 + S_0 \cdot S_2)$$

$$\alpha^i \cdot \alpha^j = (S_2^2 + S_1 \cdot S_3)/(S_1^2 + S_0 \cdot S_2)$$

$$0 \leq j, \, i \leq 31, \, j \neq i$$

Furthermore, in accordance with the following equation, error components $E_j$ and $E_i$ can be evaluated.

$$\begin{bmatrix} E_j \\ E_i \end{bmatrix} = 1/(\alpha^j + \alpha^i) \begin{bmatrix} S_1 + \alpha^i \cdot S_0 \\ -S_1 + \alpha^j \cdot S_0 \end{bmatrix}$$

As to data error detection and correction in the CD by means of the above described Reed-Solomon Code method, more detail description was made in Japanese Patent Application Laid-open No. 77529/1985.

In a circuit in which the above described data error detection and correction can be performed, there were disadvantages that a ROM for converting the data into a logarithm and a number of multiplying and dividing circuits become necessary, that especially, in detecting double errors, since it is necessary to repeatedly execute multiplication and division, it takes a long time to detect data errors and to calculate error positions, and that the number of timing signals necessary for calculation becomes large.

SUMMARY OF THE INVENTION

Therefore, a principal object of the present invention is to provide a novel method and circuit for detecting a data error.

Another object of the present invention is to provide a method and circuit for detecting a data error, wherein it is possible to reduce the number of timing signals necessary for calculation.

Another object of the present invention is to provide a method and circuit for detecting a data error, wherein it is possible to reduce the number of components or elements.

Another object of the present invention is to provide a method and circuit for detecting a data error, wherein a circuitry construction becomes simple.

The other object of the present invention is to provide a method and circuit for detecting a data error, wherein error detecting speed can become fast.

A method for detecting a data error in accordance with the present invention comprising the following steps of: calculating syndromes $S_0$, $S_1$, $S_2$ and $S_3$ based upon a plurality of data including parity data; detecting that no errors occur when all of the syndromes $S_0$, $S_1$, $S_2$ and $S_3$ are "0"; when all of the syndromes $S_0$, $S_1$, $S_2$ and $S_3$ are not "0", repeating division of the syndromes $S_0$, $S_1$, $S_2$ and $S_3$ by 1, $\alpha$, $\alpha^2$ and $\alpha^3$ ($\alpha$ is a root of a polynomial of degree eight); determining whether or not quotients $S_0'$, $S_1'$, $S_2'$ and $S_3'$ satisfy the following equations (a), (b) and (c) at every timing when the division is executed;

$$S_0' = S_1' = S_2' = S_3' \neq 0 \tag{a}$$

$$(S_0' + S_1')(S_2' + S_3') = (S_1' + S_2')^2 \tag{b}$$

$$(S_0' + S_2')(S_2' + S_3') = (S_1' + S_2')(S_1' + S_3') \tag{c}$$

when it is determined that the equation (a) is formed, detecting that a single error occurs and holding the number of times j of the division as data indicative of an error position; and when it is determined that the equations (b) and (c) are formed by numbers of times j and i of the division, detecting that double errors occur and holding the numbers of times j and i of the division as data indicative of error positions.

Furthermore, a circuit for detecting a data error in accordance with the present invention comprises: a syndrome calculating means which receives a plurality of data including parity data and calculates syndromes $S_0$, $S_1$, $S_2$ and $S_3$ and divides the syndromes $S_0$, $S_1$, $S_2$ and $S_3$ by 1, $\alpha$, $\alpha^2$ and $\alpha^3$ *l ($\alpha$ is a root of a polynomial of degree eight)*; *a counting means for counting the number of execution times of division in the syndrome calculating means*; an adding means which receives outputs $S_0'$, $S_1'$, $S_2'$ and $S_3'$ of the syndrome calculating means and evaluates $S_0' + S_1'$, $S_1' + S_2'$, $S_2' + S_3'$, $S_0' + S_2'$ and $S_1' + S_3'$; an error zero detecting means which detects that all of the syndromes $S_0$, $S_1$, $S_2$ and $S_3$ are "0" based upon outputs of the syndrome calculating means and outputs of the adding means; a single error detecting means which detects $S_0' = S_1' = S_2' = S_3' \neq 0$; a multiplying means which receives the output of the adding means and evaluates $(S_0' + S_1')(S_2' + S_3')$, $(S_1' + S_2')^2$, $(S_0' + S_2')(S_2' + S_3')$ and $(S_1'' S_2')(S_1' + S_3')$; a double error detecting means which determines whether or not equations $(S_0' + S_1')(S_2' + S_3') = (S_1' + S_2')^2$ and $(S_0' + S_2')(S_2' + S_3') = (S_1' + S_2')(S_1' + S_3')$ can be formed based upon outputs of the multiplying means; a first holding means which holds a counted value j of the counting means based upon a detection output of the single error detecting means and a first detection output of the double error detecting means; and a second holding means which holds a counted value i of the counting means based upon a second detection output of the double error detecting means.

In the above described means, the syndromes $S_0$, $S_1$, $S_2$ and $S_3$ can be evaluated in the syndrome calculating means in a manner that at every timing when a symbol is sequentially applied, an operation wherein 1, $\alpha$, $\alpha^2$ and $\alpha^3$ are respectively multiplied by the symbol and a multiplication result is added to a succeeding symbol is repeated. Such evaluated syndromes $S_0$, $S_1$, $S_2$ and $S_3$ are divided by 1, $\alpha$, $\alpha^2$ and $\alpha^3$ in synchronous with a clock signal in the syndrome calculating means. At this time, it is possible to detect a single error by determining only whether or not quotients $S_0', S_1'$, $S_2'$ and $S_3'$ of division are come into existence that $S_0' = S_1 \alpha = S_2' = S_3' = 0$, and an error position can be evaluated as a counted value of the counting means which counts the number of times of the division. Furthermore, double errors can be detected by the double error detecting means in the manner that an operation wherein $S_0' + S_1'$, $S_2' + S_3'$, $S_1' + S_2'$ and $S_1' + S_2'$ are evaluated by adding the quotients $S_0', S_1'$, $S_2'$ and $S_3'$ to each other and $(S_0' + S_1')$, $S_2' + S_3')$ and $(S_1' + S_2')$ are calculated by the multiplying means based upon the outputs of the adding means, and it is determined by the double error detecting means whether or not the multiplication results are equal to each other, and in the case where the multiplication results are equal to each other, $S_0' + S_2'$, $S_2' + S_3'$, $S_1' + S_2'$ and $S_1' + S_3'$ are evaluated by the adding means and $(S_0' + S_2')(S_2' + S_3')$ and $(S_1' + S_2')(S_1' + S_3')$ are calculated by the multiplying means based upon the outputs, and it is determined whether or not the multiplication results are equal to each other is performed at every timing when the division of the syndromes is made. In such an operation, when two equations $(S_0' + S_1')(S_2' + S_3') = (S_1' + S_2')^2$ and $(S_0' + S_2')(S_2' + S_3 +) = (S_1' + S_2')(S_1' + S_3')$ are both formed and the numbers of times of the division are twice as such j and i, it is possible to detect that double errors occur and error positions can be obtained as counted values of the counting means.

Therefore, it is possible to simplify the circuits for executing multiplication and addition, and the number of timing signals becomes small.

In accordance with the present invention, since it is possible to perform error detection by means of the timing signals for reading the symbols from the RAM and for calculating the syndromes and the timing signals for dividing the syndromes $S_0$, $S_1$, $S_2$, $S_3$ by 1, $\alpha, \alpha^2$ and $\alpha^3$, the number of the timing signals necessary for calculation can be reduced. In addition, since it becomes unnecessary to provide a ROM for logarithm converting which is utilized for directly making an operation of error detection, there is an advantage that the circuitry construction becomes simple and the number of components or elements can be reduced. Furthermore, there is a further advantage that error detection speed becomes fast.

These objects and other objects, features, aspects and advantages of the present invention will become more apparent from the following detailed description of the embodiments of the present invention when taken in conjunction with accompanying drawings.

DETAILED DESCRIPTION OF THE PREFERRED EMBODIMENTS

Prior to a description of an embodiment, first, a description will be made on data error detection in accordance with the present invention. In the case of error detection of $C_1$, syndromes $S_0$, $S_1$, $S_2$ and $S_3$ are evaluated or calculated from symbols in accordance with the above described equation (1); however, in the present invention, the equation (1) is changed as an equation (1') as follows;

$$\begin{bmatrix} S_0 \\ S_1 \\ S_2 \\ S_3 \end{bmatrix} = \begin{bmatrix} 1 & 1 & \_ & 1 & 1 \\ \alpha^{31} & \alpha^{30} & \_ & \alpha & 1 \\ \alpha^{52} & \alpha^{50} & \_ & \alpha^2 & 1 \\ \alpha^{93} & \alpha^{90} & \_ & \alpha^3 & 1 \end{bmatrix} \begin{bmatrix} D_{31} \\ D_{30} \\ \\ D_0 \end{bmatrix} \quad (1')$$

In the equation (1'), suffixes added to characters D indicative of the symbols are changed in reverse of that of the equation (1), and thus, a symbol $D_{31}$ in the equation (1') is actually a symbol $D_0$. This means that actual symbols are named as $D_0$, $D_1$, $D_2$ ... $D_{31}$ in the order that the symbols are read from the disc; however, in the present invention, the symbols are named as $D_{31}$, $D_{30}$ ... $D_0$ in the reverse order, and therefore, addresses therefor are assigned in the reverse order.

If there are no errors in the symbols $D_{31}$–$D_0$, all of the syndromes $S_0$, $S_1$, $S_2$ and $S_3$ becomes "0". However, in the case where errors occur in symbols $D_i$ and $D_j$ ($j \leq i$), the syndromes can be calculated in accordance with a following equation (2).

$$S_0 = E_i + E_j \quad (2)$$

$$S_1 = \alpha^i E_i + \alpha^j E_j$$

$$S_2 = \alpha^{2i} E_i + \alpha^{2j} E_j$$

$$S_3 = \alpha^{3i} E_i + \alpha^{3j} E_j$$

where, each of $E_i$ and $E_j$ is an error component.

When such calculated syndromes $S_0$, $S_1$, $S_2$ and $S_3$ are respectively divided by $1$, $\alpha$, $\alpha^2$ and $\alpha^3$ j times, the syndromes respectively become $S_0'$, $S_1'$, $S_2'$ and $S_3'$ represented by a following equation (3), $$S_0' = S_0 = E_i + E_j \quad (3)$$

$$S_1' = S_1/\alpha^j = \alpha^{i-j} E_i + E_j$$

-continued $$S_2' = S_2/\alpha^{2j} = \alpha^{2(i-j)} E_i + E_j$$

$$S_3' = S_3/\alpha^{3j} = \alpha^{3(i-j)} E_i + E_j$$

In accordance with the equation (3), following equations (4)–(8) can be evaluated.

$$S_0' + S_1' = E_i(1 + \alpha^{i-j}) \quad (4)$$

$$S_1' + S_2' = \alpha^{i-j} E_i(1 + \alpha^{i-j}) \quad (5)$$

$$S_2' + S_3' = \alpha^{2(i-j)} E_i(1 + \alpha^{i-j}) \quad (6)$$

$$S_0' + S_2' = E_i(1 + \alpha^{i-j})^2 \quad (7)$$

$$S_1' + S_3' = \alpha^{(i-j)} E_i(1 + \alpha^{i-j})^2 \quad (8)$$

Now, in the case of a single error, if $i=j$ and $E_i=0$, a following equation (9) can be obtained in accordance with the equations (4), (5), and (6).

$$S_0' + S_1' = S_1' + S_2' = S_2' + S_3' \neq 0 \quad (9)$$

$$(S_0' = S_1' = S_2' S_3' = 0)$$

Therefore, by determining whether or not the equation (9) can be formed, it is possible to detect a single error. An error position at this time can be represented by the number of times j of the division of the syndromes $S_0$, $S_1$, $S_2$ and $S_3$, and the error component $E_j$ becomes a value of the syndrome $S_0$.

On the other hand, in the case of double errors, following equations (10), (11) and (12) can be obtained in accordance with the equations (4) and (5), (5) and (6), and (7) and (8), respectively and following equations (13) and (14) can be obtained in accordance with the equations (10), (11) and (12).

$$(S_1' + S_2')/(S_0' + S_1') = \alpha^{i-j} \quad (10)$$

$$(S_2' + S_3')/(S_1' + S_2') = \alpha^{i-j} \quad (11)$$

$$(S_1' + S_3')/(S_0' + S_2') = \alpha^{i-j} \quad (12)$$

$$(S_0' + S_1')/(S_2' + S_3') = (S_1' + S_2')^2 \quad (13)$$

$$(S_0' + S_2')/(S_2' + S_3') = (S_1' + S_2')(S_1' + S_3') \quad (14)$$

This means that the equations (13) and (14) can be formed when the numbers of times of the division of the syndromes $S_0$, $S_1$, $S_2$ and $S_3$ by $1$, $\alpha$, $\alpha^2$ and $\alpha^3$ become j and i, whereby it is possible to detect the double errors and error positions j and i can be evaluated.

The error component $E_i$ can be evaluated by a following equation (15) in accordance with the (4).

$$E_i = (S_0' + S_1')/(1 + \alpha^{i-j}) \quad (15)$$

In the equation (15), it is possible to change "$1+\alpha^{i-j}$" into $\alpha^x$ in the Galois field, and therefore, by converting the same into $\alpha^x$ by means of an ROM addresses of which are assigned with values of i-j, and by dividing $S_0' + S_1'$ by $\alpha^x$, the error component $E_i$ is evaluated. The error component $E_j$ can be evaluated by an equation $E_j = S_0 - E_i$ because $S_0 = E_i + E_j$.

Figure 1:
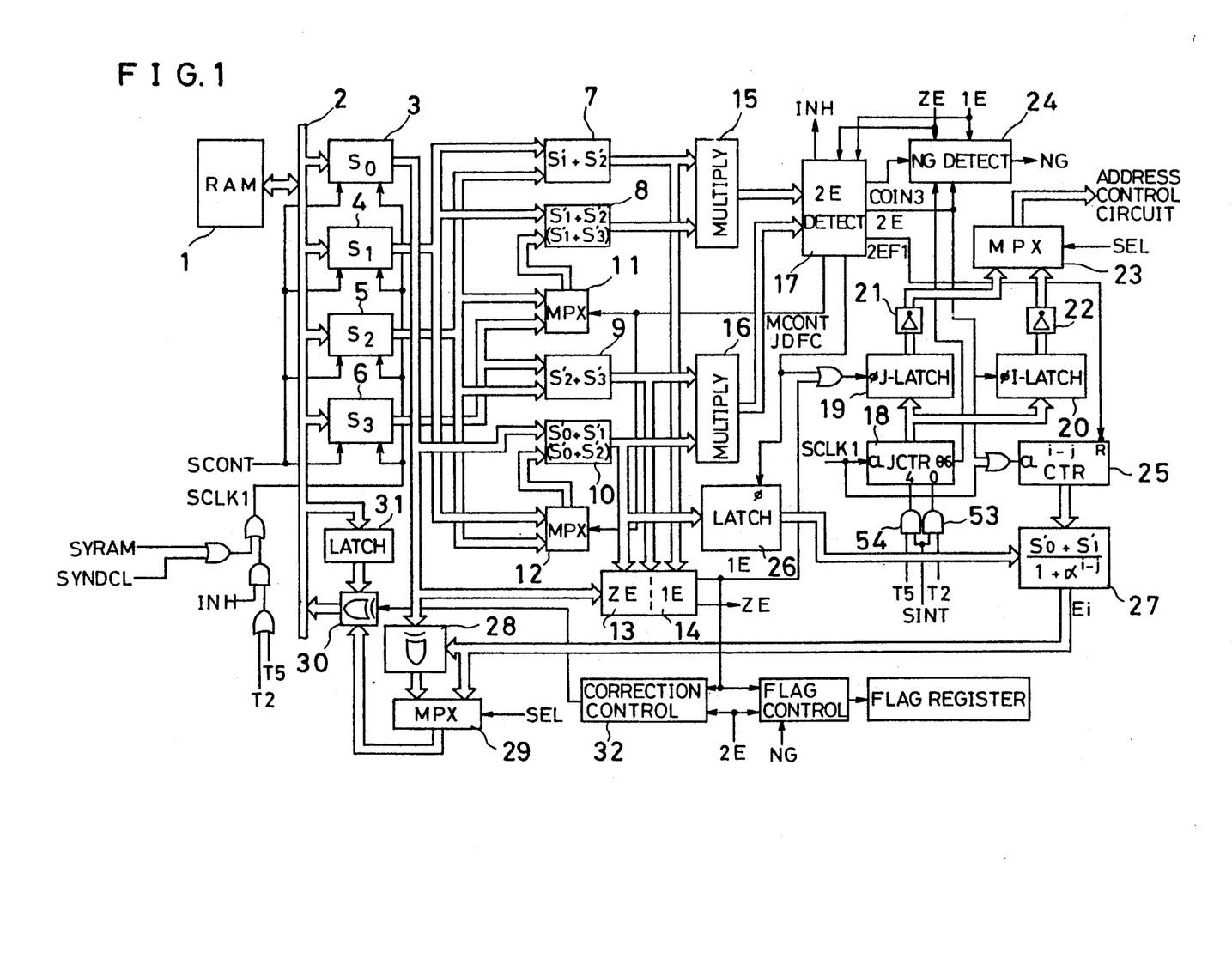
FIG. 1 is a block diagram showing one embodiment in accordance with the present invention.

One embodiment of an error detection circuit which is constructed in accordance with the above described error detection method is shown in FIG. 1. In FIG. 1, a RAM 1 is a memory to which the symbols $D_0$–$D_{31}$ (the suffixes added to the characters D are representative of an actual addressing order) which has been EFM-converted in each frame are written in a predetermined order by an address control circuit (not shown), which being read or written when error detection and correction of $C_1$ and $C_2$ is to be performed or when the data is to be outputted for D/A converting, and which being connected to a data bus 2. Syndrome calculating circuits 3, 4, 5 and 6 are respectively connected to the data bus 2, each of which receiving the symbols $D_{31}-D_0$ (the suffixes added to the characters D are representative of the reverse addressing order of the actual addressing order, and hereinafter, such reverse addresses are utilized) which are sequentially read from the RAM 1, and which making the calculation in accordance with the above described equation (1') and evaluating $S_0'$, $S_1'$, $S_2'$ and $S_3'$ by dividing calculated syndromes $S_0$, $S_1$, $S_2$ and $S_3$ by 1, $\alpha$, $\alpha^2$ and $\alpha^3$, respectively. In addition, the syndrome calculating circuits 3, 4, 5 and 6 are operated in synchronous with a clock pulse SCLK which is produced by a timing signal SYRAM for reading the symbols $D_{31}-D_0$ from the RAM 1 and a timing signal SYNDCL for executing the division, and change between an operation for calculating the syndrome and an operation for executing the division can be performed by a control signal SCONT.

Each of adding circuits 7, 8, 9 and 10 has two inputs to which 8-bit data are respectively applied, which making addition of Modulo 2 by executing E-OR (Exclusive OR) of respective bits of the applied data. Outputs $S_1'$ and $S_2'$ of the syndrome calculating circuits 4 and 5 are applied to the inputs of the adding circuit 7, and an output $S_1'$ of the syndrome calculating circuit 4 and an output of a selecting circuit (multiplexer MPX) 11 are applied to the inputs of the adding circuit 8. The multiplexer 11 receives outputs $S_2'$ and $S_3'$ of the syndrome calculating circuits 5 and 6 and selects any one of them. Therefore, the adding circuit 8 makes addition of $S_1'+S_2'$ or $S_1'+S_3'$. On the other hand, the outputs $S_2'$ and $S_3'$ of the syndrome calculating circuits 5 and 6 are applied to the inputs of the adding circuit 10, and an output $S_0'$ of the syndrome calculating circuit 3 and an output of a selecting circuit (multiplexer MPX) 12 are applied to the inputs of the adding circuit 10. The multiplexer 12 receives the outputs $S_1'$ and $S_2'$ of the syndrome calculating circuits 4 and 5 and selects any one of them. Therefore, the adding circuit 10 makes addition of $S_0'+S_1'$ or $S_0'+S_2'$.

An error zero detecting circuit 13 and a single error detecting circuit 14 respectively receive outputs of the adding circuits 7, 9 and 10 and the output $S_0'$ of the syndrome calculating circuit 3 and detect an error zero and a single error, respectively. More specifically, the error zero detecting circuit 13 detects that the symbols $D_{31}-D_0$ are correct and no errors occur therein based upon determination of $S_0=0$ and $S_0+S_1=S_1+S_2=S_2+S_3$ at a timing when the syndromes $S_0$, $S_1$, $S_2$ and $S_3$ are calculated, and outputs a detection signal ZE. On the other hand, the single error detecting circuit 14 determines whether or not a quotients $S_0 \neq 0$ and whether or not the equation (9) can be formed at every timing when the calculated syndromes $S_0$, $S_1$, $S_2$ and $S_3$ are divided by 1, $\alpha$, $\alpha^2$ and $\alpha^3$ in the syndrome calculating circuits 3, 4, 5 and 6, and detects that a single error occurs in the symbols when $S_0'=0$ and the equation (9) is formed, and outputs a detection output 1E.

A multiplying circuit 15 multiplies the 8-bit outputs from the adding circuits 7 and 8, and outputs a multiplied output $(S_1'+S_2')^2$, that is, a right term of the equation (13) when the multiplexer 12 selects $S_2'$ and a multiplied output $(S_1'+S_2')(S_1'+S_3')$, that is, a right term of the equation (14) when the multiplexer 11 selects the output $S_3'$. On the other hand, the multiplying circuit 16 multiplies the 8-bit outputs from the adding circuits 9 and 10, and outputs a multiplied output $(S_2'+S_3')(S_0'+S_1')$, that is, a left term of the equation (13) when the multiplexer 12 selects $S_1'$ and a multiplied output $(S_2'+S_3')(S_0'+S_2')$, that is, a left term of the equation (14) when the multiplexer 12 selects $S_2'$. The outputs of the multiplying circuits 15 and 16 are applied to a double error detecting circuit 17.

The double error detecting circuit 17 determines whether or not the 8-bit outputs of the multiplying circuits 15 and 16 are coincident with each other by making E-OR of the respective bits thereof. The double error detecting circuit 17 outputs an inhibit signal INH for stopping the division in the syndrome calculating circuits 3, 4, 5 and 6 when such coincidence is detected, and further outputs a control signal MCONT for controlling the multiplexers 11 and 12.

More specifically, the multiplexers 11 and 12 respectively select the outputs $S_2'$ and $S_1'$ until the control signal MCONT is outputted, and therefore, the double error detecting circuit 17 first determines whether or not the equation (13) can be formed, and when it is detected that the equation (13) is formed, the outputs $S_3'$ and $S_2'$ are respectively selected by the multiplexers 11 and 12 in response to the control signal MCONT, and thereafter, the double error detecting circuit 17 determines whether or not the equation (14) can be formed. Such detecting operation of the double error detecting circuit 17 is made at every timing when the division by 1, $\alpha$, $\alpha^2$ and $\alpha^3$ is made in the syndrome calculating circuits 3, 4, 5 and 6.

Furthermore, in the case where it is detected that the equations (13) and (14) are formed in the double error detecting circuit 17, this is stored in an internal flag and the double error detecting circuit 17 outputs a control signal JDFC so as to stop outputting the control signal MCONT and the inhibit signal INH, thereafter, in order to determine whether or not the equations (13) and (14) can be formed, the double error detecting circuit 17 makes the syndrome calculating circuits 3, 4, 5 and 6 continue the division. In addition, in the case where it is detected that the equations (13) and (14) are formed for the second time based upon the internal flag, the double error detecting circuit 17 detects that two or more error occur in the symbols and outputs a detection output 2E. In the case where it is detected for the third time that the equations (13) and (14) are formed, the double error detecting circuit 17 detects that there are errors which can not be corrected and outputs a signal COIN3.

On the other hand, the detection outputs ZE and 1E are applied to the double error detecting circuit 17 from the error zero detecting circuit 13 and the single error detecting circuit 14, and when the detection output ZE or 1E are generated, the double error detecting circuit 17 outputs the inhibit signal INH so as to stop the succeeding division in the syndrome calculating circuits 3, 4, 5 and 6.

A counting circuit 18 is a 6-bit counter which counts the number of times of the division by counting the clock pulse SCLK1 which makes the syndrome calculating circuits 3, 4, 5 and 6 execute the division by 1, $\alpha^2$ and $\alpha^3$. The lower 5 bits of an output of the counting circuit 18 are applied to a J-latch 19 which is a first error position holding means and an I-latch 20 which is a second error position holding means, respectively. The J-latch 19 is composed of 5 D-FFs, a latch operation of which is controlled by the detection output 1E of the single error detecting circuit 14 and the output JDFC of the double error detecting circuit 17. The J-latch 19 holds a counted value of the counting circuit 18 as data indicative of an error position j when the detection output 1E or JDFC is outputted. The I-latch 20 is composed of 5 DFFs, a latch operation of which is controlled by the output 2E of the double error detecting circuit 17. The I-latch 20 holds a counted value of the counting circuit 18 as data indicative of an error position i when the output 2E is generated. The error positions j and i being held in the J-latch 19 and the I-latch 20 are both inverted by inverters 21 and 22, being supplied the address control circuit (not shown) of the RAM 1 through selection by a multiplexer 23. This means that the error positions j and i designates the address of the symbol in which an error occurs and the same are utilized for correcting the symbol. A reason why the data of j and i are inverted by the inverters 21 and 22 is that the addresses of the symbols $D_0$–$D_{31}$ are to be put back in its actual order because the same are assigned in the reverse order as described above.

In addition, an output $Q_6$ for the 6th bit of the counting circuit 18 is applied to a correction impossibility detecting circuit 24. The correction impossibility detecting circuit 24 detects that there are 3 or more errors in the symbols and the same can not be correct, based upon the detection outputs ZE, 1E, 2E and COIN3. More specifically, in the case where both of the detection outputs ZE and 1E are not outputted and the signal COIN3 is outputted, or in the case where the detection outputs ZE, 1E and 2E are not outputted when the output $Q_6$ of the counting circuit 18 becomes "1" even though the division in the syndrome calculating circuits 3, 4, 5 and 6 are terminated 32 times or 28 times, the correction impossibility detecting circuit 24 outputs a detection output NG indicative of impossibility of correction.

An i-j counter 25 is an i-j calculating means which evaluates difference i-j of the error positions necessary for calculating the error component Ei indicated in the equation (15), which being a 5-bit counter which counts the clock pulse SCLK1. A reset state of the i-j counter 25 is released by an inverted signal of an output 2EF1 of an internal flag which is set when the double error detecting circuit 17 detects for the first time that the equations (13) and (14) are formed. The i-j counter 25 is stopped to count when the clock pulse SCLK1 is interrupted by the detection output 2E which is outputted at the second detection. Therefore, in the case of the double errors, counting operation of the i-j counter 25 is started at the timing of the division for (j+1)th time and stopped at the timing of the division for i-th time. Therefore, a counted value of the i-j counter 25 becomes i-j.

An $S_0' + S_1'$ register 26 is an $S_0' + S_1'$ holding means which is composed of 8 D-FFs, latch operation of which is performed by the output JDFC when the double error detecting circuit 17 detects for the first time that the equations (13) and (14) are formed, whereby $S_0' + S_1'$ which is outputted from the adding circuit 10 can be held in the $S_0' + S_1'$ register 26.

An error component calculating circuit 27 receives the outputs of the $S_0\alpha + S_1'$ register 26 and the i-j counter 25, and calculates the error component $E_i$ of the error position i based upon the equation (15). In the error component calculating circuit 27, a decoder system for converting $1 + \alpha^{i-j}$ into $\alpha^x$ to make calculation simple.

An adding circuit 28 to which an output $E_i$ of the error component calculating circuit 27 is applied evaluates a sum of Modulo 2 of $S_0'$ which is a sum of the error components $E_i$ and $E_j$ and is equal to the syndrome $S_0$ and the error component $E_i$ calculated in the error component calculating circuit 27 such that error component $E_j$ can be evaluated by E-OR for each bit.

Calculated error components $E_i$ and $E_j$ are applied to a multiplexer 29, being selectively outputted by a control signal SEL which is the same as that for the multiplexer 23. More specifically, when the error position data i is selectively outputted from the multiplexer 23, the error component $E_i$ is outputted from the multiplexer 29, and the error component $E_j$ is selected when the error position data j is selected.

An adding circuit 30 to which an output of the multiplexer 29 is applied and a register 31 which is composed of D-FFs of 8 bits make error correction. More specifically, the erroneous symbol $D_i$ or $D_j$ which is read from the RAM 1 based upon the error position data i or j being applied to the address control circuit through selection of the multiplexer 23 is held in the register 31, and in the adding circuit 30, a sum of Modulo 2 of the erroneous symbol $D_i$ or $D_j$ and the error component $E_i$ or $E_j$ is made, and an addition result, that is, a corrected symbol is stored again in the same address of the RAM 1. An operation of the adding circuit 30 is controlled by a control signal ENA which is outputted from a correction control circuit 32, and no adding operation is made in the cases of error zero and correction impossibility, and the adding operation is made in the cases of the single error and the double errors.

The above described error detection and correction circuit is a circuit which can be used for error detection and correction of the both of $C_1$ and $C_2$. However, in the case of the error detection and correction of $C_2$, since the number of symbols $D_0$–$D_{27}$ becomes 28, the number of timings when the syndromes $S_0$, $S_1$, $S_2$ and $S_3$ are calculated in the syndrome calculating circuits 3, 4, 5 and 6 is 28, and the number of times of the division by 1, $\alpha^2$ and $\alpha^3$ becomes 27. Therefore, in a time period during when the error detection and correction of $C_2$ is to be made, "4" is initially pre-set in the counting circuit 18. More detail description with respect to this point will be made later.

Next, description will be made on specific examples of major circuits shown in FIG. 1.

Figure 2:
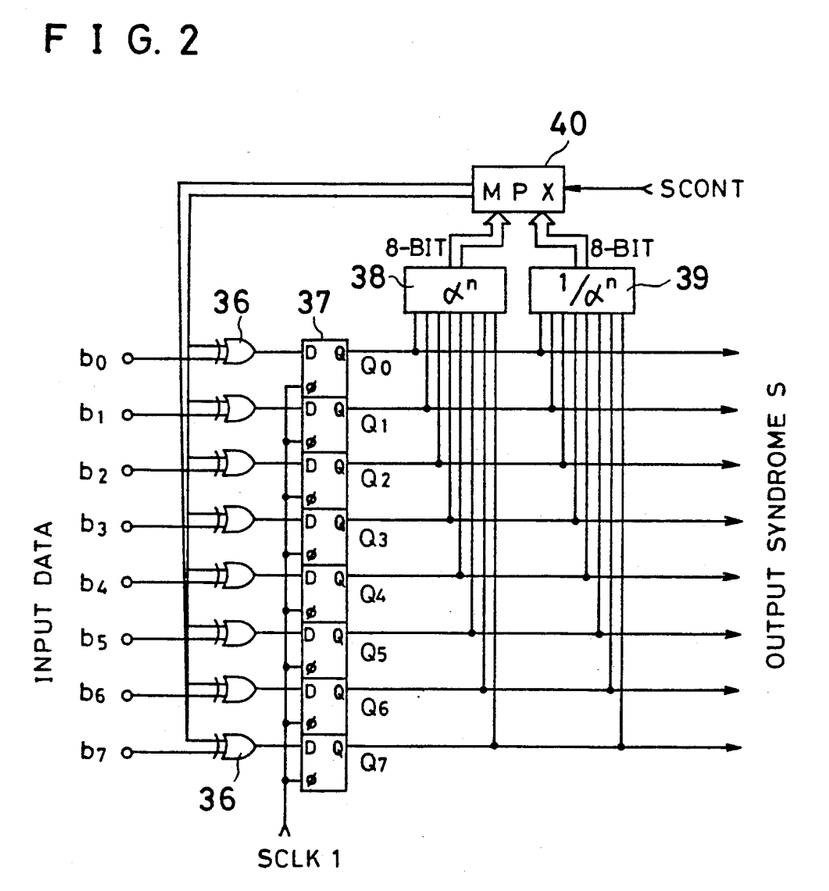
FIG. 2 is a block diagram showing a specific construction of a syndrome calculating circuit as shown in FIG. 1.

FIG. 2 shows a circuit for implementing the syndrome calculating circuits 3, 4, 5 and 6, which includes E-OR gates 36 to each of which each of bits $B_0$–$B_7$ of the symbol being sent on the data bus 2; 8 D-FFs 37 to which outputs of the E-OR gates 36 are applied; $\alpha^n$ calculating element 38 and $1/\alpha^n$ calculating element 39 to which outputs of the D-FFs 37 are respectively applied; and a multiplexer 40 which selects outputs of the calculating elements 38 and 39 and applies the same respective inputs of the E-OR gates 36. D-FFs 37 are operated by the clock pulse SCLK1 which is produced by the above described timing signals SYRAM and SYNDCL. The multiplexer 40 is controlled by the control signal SCONT which change the calculation of the syndromes $S_0$, $S_1$, $S_2$ and $S_3$ and the division by 1, $\alpha$, $\alpha^2$ and $\alpha^3$. This means that in calculating the syndromes $S_0$, $S_1$, $S_2$ and $S_3$, the $\alpha^n$ calculating element 38 is used, and in calculating $S_0'$, $S_1'$, $S_2'$ and $S_3'$ through the division, the $1/\alpha^n$ calculating element 39 is used.

Meanwhile, as seen from the equation (1'), in the syndrome calculating circuit 3, since the syndrome $S_0$ is a sum of the symbols $D_{31}$-$D_0$ and $S_0'$ is the quotient of the division $S_0$ by "1", the calculating elements 38 is $\alpha^0$ and the calculating element 39 is $1/\alpha^0$.

This means that in the case of the syndrome calculating circuit 3, the calculating elements 38 and 39 and the multiplexer 40 are not needed, and the respective outputs $Q_0$-$Q_7$ of the D-FFs 37 may be directly applied to the E-OR gates 36, respectively. Therefore, the symbol $D_{31}$ which is read for the first time from the RAM 1 in synchronous with the timing signal SYRAM for sequentially reading the symbols $D_{31}$-$D_0$ is inputted to the D-FFs 37, and the symbol $D_{30}$ which is read for the next time is conducted to the addition of Modulo 2 with the outputs of the D-FFs 37, that is, $D_{31}$ in the E-OR gates 36, being held in the D-FFs 37. Such an operation is repeated 32 times from the timing when the $D_{31}$ is read to the timing when $D_0$ is read, and when the symbol $D_0$ is read, the outputs of the D-FFs 37 becomes the syndrome $S_0$.

Figure 3A:
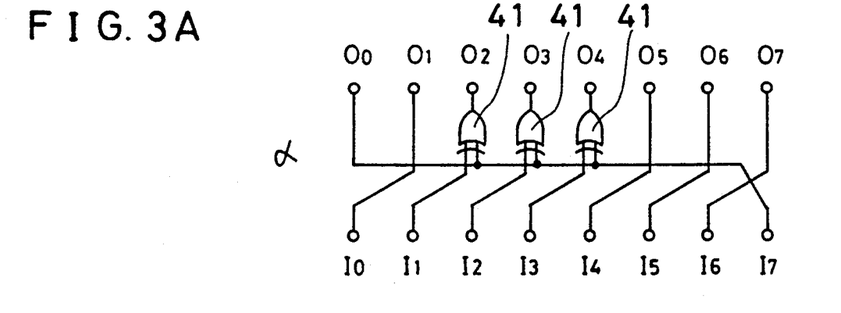
FIGS. 3A to FIG. 3D are circuit diagrams respectively showing calculating elements for $\alpha^n$ and $1/\alpha^n$ as shown in FIG. 2.
Figure 3B:
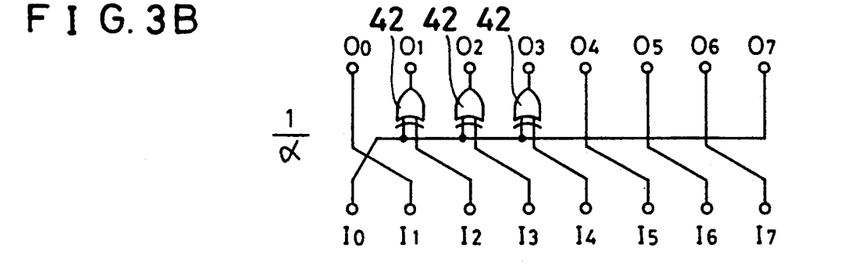

In addition, in the syndrome calculating circuit 4, the calculating element 38 is $\alpha$ and the calculating element 39 is $1/\alpha$. The $\alpha$ calculating element 38 has a circuit in which inputs $I_0$14 $I_7$ and outputs $O_0$-$O_7$ are connected to each other and 3 E-OR gates 41 are included, as shown in FIG. 3A. The $1/\alpha$ calculating element 39 is a circuit in which inputs $I_0$-$I_7$ and outputs $O_0$-$O_7$ are connected to each other and 3 E-OR gates 42 are included, as shown in FIG. 3B. Therefore, in the syndrome calculating circuit 4, the symbol $D_{31}$ which is read for the first time from the RAM 1 in synchronous with the timing signal SYRAM and stored in the D-FFs 37 is applied to the E-OR gates 36 as a multiplication result of $\alpha D_{31}$ by the $\alpha$ calculating element 38, and when the symbol $D_{30}$ is read, the addition of $\alpha D_{31} + D_{30}$ is made in the E-OR gates 36, and a result thereof is stored in the D-FFs 37. By repeating such an operation 32 times, the syndrome $S_1$ indicated in the equation (1') is calculated and outputted from the outputs $Q_0$-$Q_7$ of the D-FFs 37.

On the other hand, in the state where the $1/\alpha$ calculating element 39 is selected and the inputs $B_0$-$B_7$ of the E-OR gates 36 are made "0", at every timing when the timing signal SYNDCL is applied once, the syndrome $S_1$ being held in the D-FFs 37 is divided as such $1/\alpha$ by the $1/\alpha$ calculating element 39 and held in the D-FFs 37, and therefore, the outputs $Q_0$-$Q_7$ becomes $S_1'=S_1/\alpha$. Therefore, by sequentially applying the timing signals SYNDCL of 31 in total, it is possible to calculate $S_1'$ from $S_1/\alpha$ to $S_1/\alpha^{31}$.

Figure 3C:
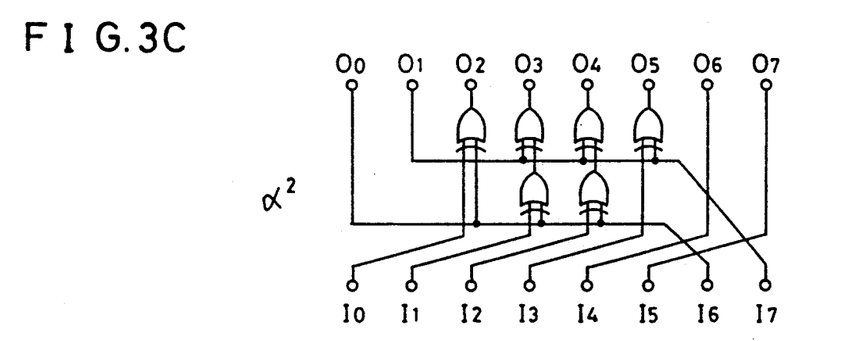
Figure 3D:
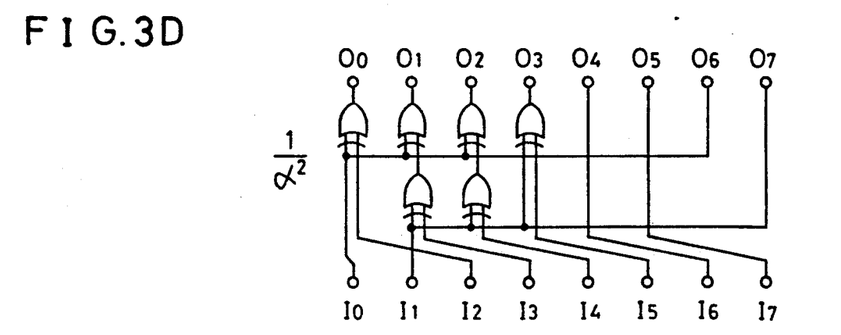

Furthermore, the calculating element 38 of the syndrome calculating circuit 5 is $\alpha^2$ and the calculating element 39 is $1/\alpha^2$. The $\alpha^2$ calculating element 38 is an element having relationship of the inputs and the outputs as shown in FIG. 3C, such an element is obtainable by series connection of 2 stages of the calculating elements shown in FIG. 3A. On the other hand, the $1/\alpha^2$ calculating element 39 is an element having relationship of the inputs and the outputs as shown in FIG. 3D, such an element is also obtained by series connection of 2 stages of the $1/\alpha$ calculating elements shown in FIG. 3B. In addition, the calculating element 38 of the syndrome calculating circuit 6 is $\alpha^3$ and the calculating element 39 is $1/\alpha^3$. The $\alpha^3$ calculating element is an element in which 3 stages of FIG. 3A elements are connected in series, and the $1/\alpha^3$ calculating element is an element in which 3 stages of FIG. 3B elements are connected in series. In the syndrome calculating circuits 5 and 6, the syndromes $S_2$ and $S_3$ indicated in the equation (1') are calculated in synchronous with the timing signal SYRAM, and the calculating of the equation (3) is made in synchronous with the timing signal SYNDCL, respectively, and thus, $S_2'$ from $1/\alpha^2$ to $1/\alpha^{52}$ and $S_3'$ from $1/\alpha^3$ to $1/\alpha^{93}$ can be calculated.

Figure 4:
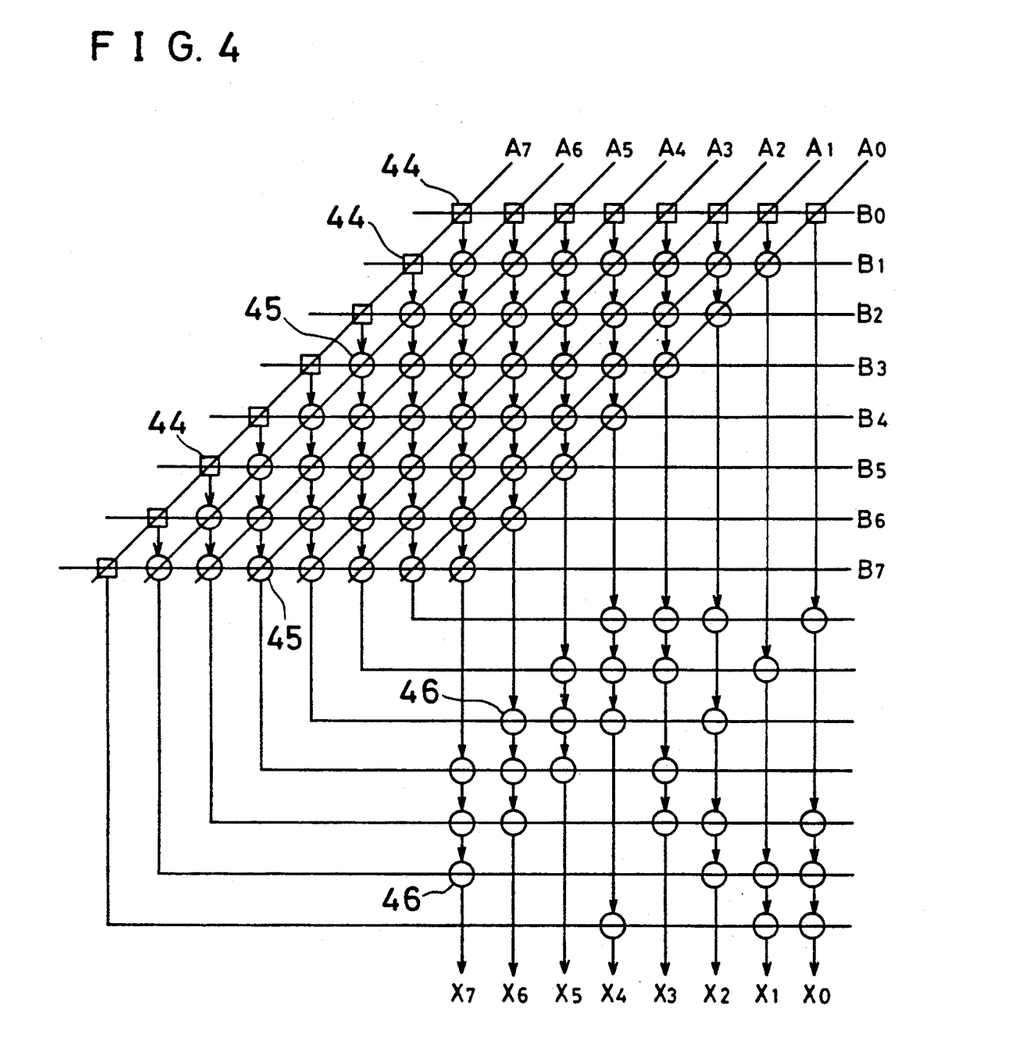
FIG. 4 is a schematic diagram showing a construction of a multiplying circuit.

FIG. 4 shows a schematic diagram of a circuit for constructing the multiplying circuits 15 and 16 as shown in FIG. 1. The data which is handled in the Reed-Solomon Code method is the data of the Galois field, and thus, multiplication of the data can be implemented only by an AND gate and E-OR gate. In FIG. 4, $A_0$-$A_7$ is 8-bit data which is applied to one input of the multiplying circuit and $B_0$-$B_7$ is 8-bit data which is applied to the other input of the multiplying circuit. In addition, the reference numeral 44 denotes an AND gate, the reference numeral 45 denotes a composite gate which is constructed by an AND gate and an E-OR gate, and the reference numeral 46 denotes an E-OR gate. Respective bits of the data $A_0$-$A_7$ and the data $B_0$-$B_7$ are supplied to the AND gates 44 and the composite gates 45 which are arranged in a matrix fashion, and respectively applied to 2 inputs of the AND gates 44 and the 2 inputs of the AND gates within the composite gates 45. Therefore, by the AND gates 44 and the AND gates within the composite gates 45, as in normal arithmetic calculation, logical products of respective bits of the data $A_0$-$A_7$ and the data $B_0$-$B_7$ can be obtained. In order to obtain the sum of Modulo 2 of the logical product outputs for each bit, outputs of the AND gates within the composite gates 45 are applied to respective one input of the E-OR gates within the composite gates 45, and to respective another input thereof, the outputs of the AND gates 44 of the pre-stage or the outputs of the composite gates 45 are applied. In addition, each of the E-OR gates 46 selects upper 7 bits of each 15-bit output of the sum of Modulo 2 which is obtained by the AND gates 44 and the composite gates 45 and makes an operation of the sum of the Modulo 2 with the output of the lower 8 bits. More specifically, in the Galois field, the upper bits are represented as the selective sum of the lower bits. For example, the 9th bit is represented as the sum of Modulo 2 of the 1st bit, 3rd bit, 4th bit and 5th bit, and therefore, by arranging the E-OR gates 46 as shown in FIG. 4, the multiplication outputs $X_0$-$X_7$ can be obtained. Thus, each of the multiplying circuits 15 and 16 can be constructed by 64 AND gates and 77 E-OR gates without using a clock pulse, which outputs the multiplication result at every timing when the data is inputted in a real time fashion.

Figure 5:
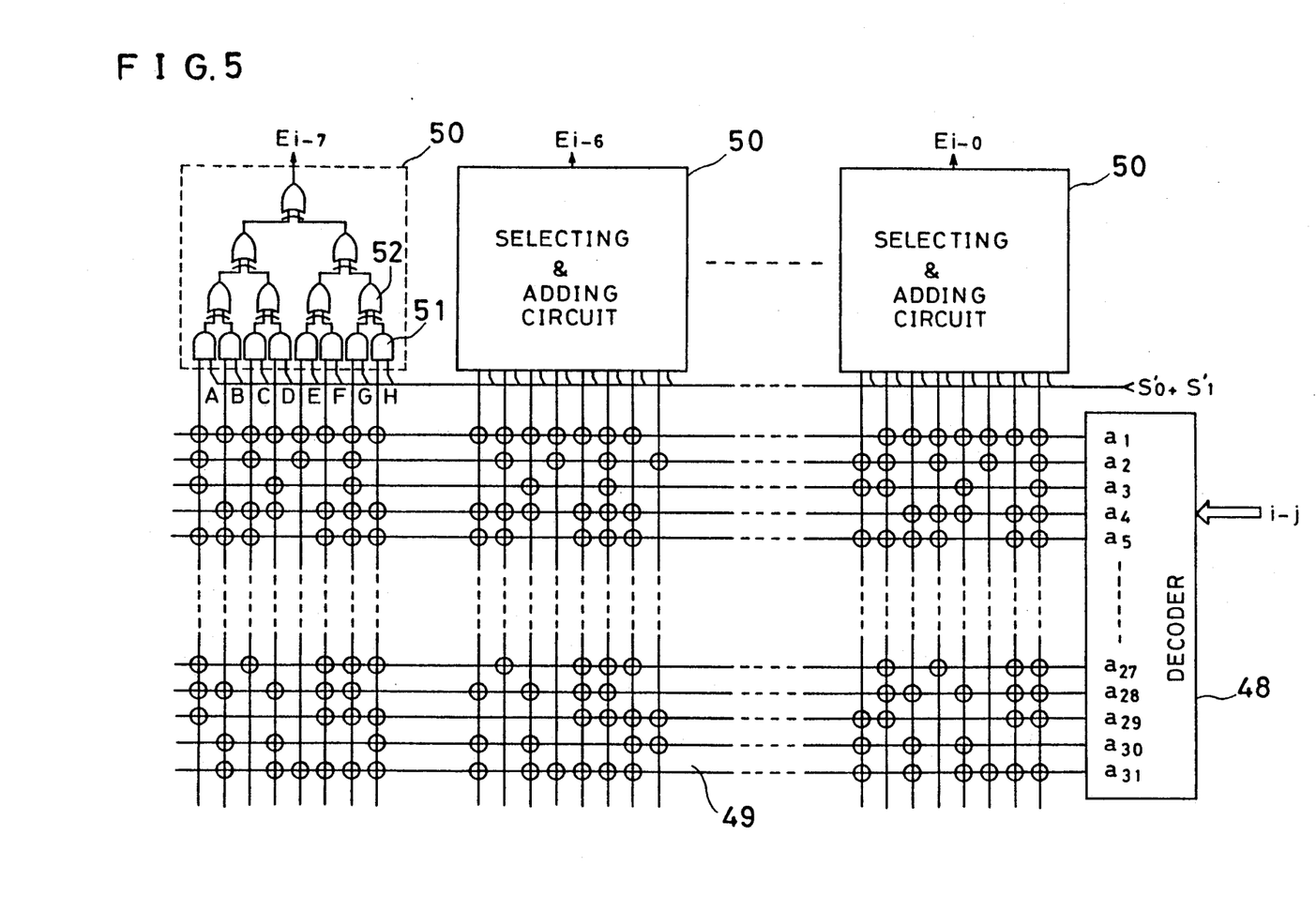
FIG. 5 is a circuit diagram showing a construction of an error component calculating circuit.
Figures 6A, 6B:
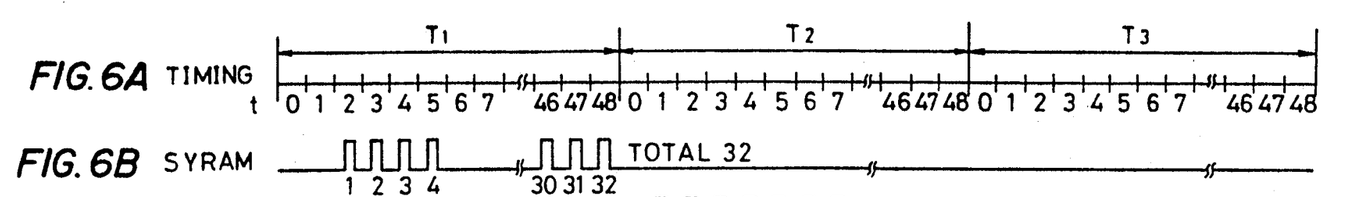
FIGS. 6A to 6H is a timing chart showing an operation of FIG. 1 embodiment.
Figure 6C:
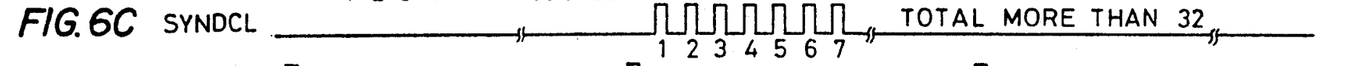
Figure 6D:
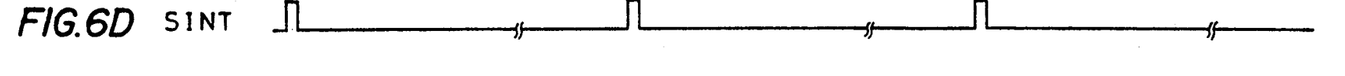
Figure 6E:
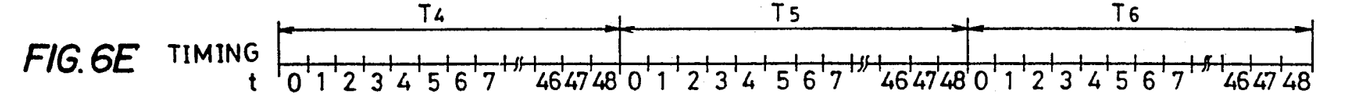
Figure 6F:
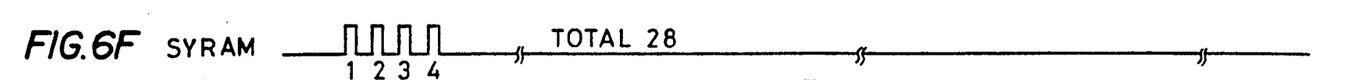
Figure 6G:
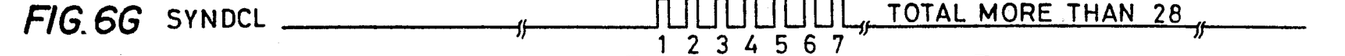
Figure 6H:
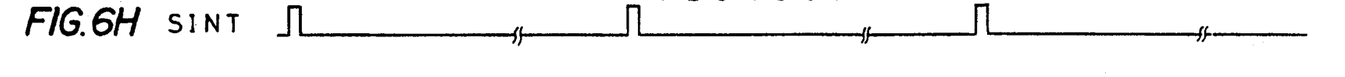

FIG. 5 is a circuit diagram of the error component calculating circuit 27 which includes a decoder 48 which receives a counted value of the i-j counter 25 and outputs address signals $a_1$-$a_{31}$; a ROM 49 which receives the address signals $a_1$-$a_{31}$; and a selecting and adding circuits 50 in each of which the 8-bit data of $S_0'+S_1'$ (in FIG. 5, reference characters A, B, C, ... G, H are indicated from the least significant bit to the most significant bit) are selectively added in accordance with an output of the ROM 49 so as to produce respective bits $E_{i\text{-}0}$-$E_{i\text{-}7}$ (8 bits in total) of the error component $E_i$. As described above, error component calculating circuit 27 is a means for calculating the equation (15), in this case, it is possible to convert $1+\alpha^{i\cdot j}$ into $\alpha^x$. The ROM 49 makes conversion from $1+\alpha^{i\cdot j}$ to $\alpha^x$ and decides respective bit-constructions of the result in the case where the 8-bit data is divided by $\alpha^x$. For example, in the case of i-j=1, $1+\alpha$ is converted into $\alpha^{25}$ and respective bits of the error component $E_i$ which is obtained by division $S_0'+S_1'$ by $\alpha^{25}$ can be represented as follows;

$$E_{i-7} = A + B + C + D + E + F + G + H$$

$$E_{i-6} = A + B + C + D + E + F + G$$

$$E_{i-5} = A + B + C + D + E + F$$

$$E_{i-4} = A + B + C + D + E$$

$$E_{i-3} = E + F + G + H$$

$$E_{i-2} = A + B + C$$

$$E_{i-1} = C + D + E + F + G + H$$

$$E_{i-0} = B + C + D + E + F + G + H$$

Therefore, the selecting and adding circuits 50 which produce respective bits $E_{i\cdot 7}$-$E_{i\cdot 0}$ select 8-bit data A–H of $S_0'+S_1'$ based upon signals respectively outputted from the ROM 49 by means of AND gates 51 and make the addition of the Modulo 2 by means of E-OR gates 52. Therefore, even though the division is not executed actually, only by applying the counted value of the i-j counter 25, the error component $E_i$ can be obtained in a real time fashion.

Next, an operation of the error detection and correction of $C_1$ and $C_2$ which is performed by the circuit as shown in FIG. 1 will be briefly described with reference to FIGS. 6A to 6H As shown in FIGS. 6A to 6H, a processing period of 1 frame is composed of timings $T_1$-$T_6$ and 49 timings $t_0$-$t_{48}$ which constructs each of the timings $T_1$-$T_6$. Error detection and correction of $C_1$ is performed at the timings $T_1$-$T_3$ and the error detection and correction of $C_2$ is performed at the timings $T_4$-$T_6$.

First, the syndrome calculating circuits 3, 4, 5 and 6 and the D-FFs of each portions, etc. are reset by a clear pulse SINT which is generated at the timing $t_0$ of the timing $T_1$. The timing $T_1$ is a timing for sequentially reading 32 symbols $D_{31}$-$D_0$ being stored in the RAM 1 and calculating the syndromes $S_0$, $S_1$, $S_2$ and $S_3$, and the timing signals SYRAM are arranged or distributed to be generated 32 in total within the timings $t_0$-$t_{48}$. Therefore, when the 32nd timing signal SYRAM is generated, calculation of the syndromes $S_0$, $S_1$, $S_2$ and $S_3$ is terminated.

Next, the timing $T_2$ is a timing for error detection, and the timing signals SYNDCL are arranged or distributed to be generated 32 or more in total within the timing $T_2$. In addition, by a clear pulse SINT which is generated at the timing $t_0$ of the timing $T_2$, an output of an AND gate 53 as shown in FIG. 1 is generated and "0" is preset in the counting circuit 18. Therefore, at every timing when the timing signal SYNDCL is generated, the counting circuit 18 is incremented and the division by 1, $\alpha$, $\alpha^2$ and $\alpha^3$ is executed once in the syndrome calculating circuits 3, 4, 5 and 6, whereby a single error detection or double errors detection are made based upon the result thereof. When all of the timing signals SYNDCL are generated, in the case where there is a single error or double errors, one position of the error positions is latched in the j-latch 19 and the other position i is latched in the i-latch 20 and the difference of the error positions is held in the i-j counter 25 and $S_0'+S_1'$ is held in the register 26. Furthermore, a detection result of an error zero, a single error, double errors or correction impossibility is communicated to the correction control circuit 32.

The timing $T_3$ is a timing for performing error correction, which is divided by the control signal SEL into a timing when the error position i is selected and the symbol $D_i$ is read from the address and a timing when the symbol $D_i$ being corrected by the adding circuit 30 is written in the same address of the RAM 1, and as similar thereto, a timing for reading the symbol $D_j$ and a timing for writing the same as corrected are formed.

In the case where the error detection and correction of $C_2$, the number of symbols to be subjected to the error detection and correction becomes 28 of $D_{27}$-$D_0$. Therefore, during the timing $T_4$, there are 28 timing signals SYRAM for reading the symbols $D_{27}$-$D_0$ and calculating the syndrome $S_0$, $S_1$, $S_2$ and $S_3$. By a clear pulse SINT which is generated at the timing $t_0$ of the timing $T_4$, the data being held when error detection or correction of $C_1$ is performed are all cleared, and therefore, in synchronous with 28 timing signals SYRAM, the syndrome $S_0$, $S_1$, $S_2$ and $S_3$ of $C_2$ are obtained.

At the timing $T_5$, when a clear pulse SINT is generated at the timing $t_0$, an output is obtained from an AND gate 54 shown in FIG. 1 and "4" is preset in the counting circuit 18.

Now, the reason why "4" is preset is described. As described above, in the RAM 1, as shown in the following table, the addresses are assigned in the order where the symbols are read from the disc.

TABLE

| Address | 0 | 1 | 2 | 3 | — | — | 30 | 31 |
|---|---|---|---|---|---|---|---|---|
| Symbol | $D_0$ | $D_1$ | $D_2$ | $D_3$ | — | — | $D_{30}$ | $D_{31}$ |
| Values of i, j | 31 | 30 | 29 | 28 | — | — | 1 | 0 |

However, as indicated in the equation (1), the indexes of $\alpha$ which is multiplied into the symbols $D_0$-$D_{31}$ are in the reverse order of the addresses, and therefore, i and j which are evaluated by the circuit as shown in FIG. 1 becomes in the reverse order of the actual addresses. Therefore, as shown in FIG. 1, by inverting 5-bit binary data ($2^5 32$) indicative of i and j by means of the inverters 21 and 22, the actual addresses can be obtained. However, in the case of error detection and correction of $C_2$, the symbols to be processed are the symbols stored in the addresses 0–27, and therefore, possible values of i and j becomes 0–27. Therefore, if each of the values of i and j is inverted as it is, the results are deviated from the actual addresses by "4", and therefore, prior to inverting the same, "4" is to be added. This means that an adding circuit for adding "4" is needed; however, if "4" is preset in advance in the counting circuit 18 which counts j, such as adding circuit is not needed, whereby the same circuit can be used in the error detection and correction of $C_1$ or $C_2$.

After that "4" is preset in the counting circuit 18, the number of timing signals SYNDCL generated for the timing $T_5$ becomes 28 or more, and thus, by the timing signals, the error detection of $C_2$ can be made in the similar manner in the above described timing $T_2$.

Then, at the timing $T_6$, in the same manner at the timing $T_3$, the error correction of $C_2$ can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for detecting a data error, comprising steps of:

calculating syndromes $S_0$, $S_1$, $S_2$ and $S_3$ based upon a plurality of data including parity data;

dividing the syndromes $S_0$, $S_1$, $S_2$ and $S_3$ by 1, $\alpha$, $\alpha^2$ and $\alpha^3$ ($\alpha$ is a root of polynomial of degree eight) i times or j times to produce quotients $S_0'$, $S_1'$, $S_2'$ and $S_3'$; and indicating an error position by said i or j when it is detected that the quotients $S_0'$, $S_1'$, $S_2'$ and $S_3'$ satisfy the following equations $$(S_0'+S_1')(S_2'+S_3')=(S_1'+S_2')^2$$

$$(S_0'+S_2')(S_2'+S_3')=(S_1'+S_2')(S_1'+S_3').$$

2. A method in accordance with claim 1, wherein said plurality of data including parity data are data based upon Read-Solomon Code.

3. A method for detecting a data error, comprising the following steps of:

calculating syndromes $S_0$, $S_2$ and $S_3$ based upon a plurality of data including parity data;

detecting that no errors occur when the syndromes $S_0$, $S_2$ and $S_3$ satisfy $S_0=S_1=S_2=S_3=0$;

when $S_0=S_1=S_2=S_3=0$, repeating division of the syndromes $S_0$, $S_1$, $S_2$ and $S_3$ by 1, $\alpha$, $\alpha^2$ and $\alpha^3$ a number of times j ($\alpha$ is a root of a polynomial of degrees eight) to produce quotients $S_1'$, $s_1'$, $s_2'$ and $S_3'$;

determining whether or not the quotients $S_0'$, $S_1'$, $S_2'$ and $S_3'$ satisfy the following equations (a), (b) and (c) at every timing when the division is executed;

$$S_0'=S_1'=S_2'=S_3'=0 \qquad (a)$$

$$(S_0'+S_1')(S_2'+S_3')=(S_1'+S_2')^2 \qquad (b)$$

$$(S_0'+S_2')(S_2'+S_3')=(S_1'+S_3') \qquad (c)$$

when it is determined that the equation (a) is formed, detecting that there is one erroneous data and holding the number of times j of the division as data indicative of an error position;

when the equations (b) and (c) are formed, detecting that there are 2 or more erroneous data and holding the number of times j of the division as data indicative of an error position of one erroneous data;

repeating the division by 1, $\alpha$, $\alpha^2$ and $\alpha^3$ a number of times i and determining whether or not the quotients $S_0'$, $S_1'$, $S_2'$ and $S_3'$ satisfy the equation (b) and (c) are formed, detecting that there are 2 erroneous data and holding the number of times i as data indicative of an error position of the other erroneous data.

4. A method in accordance with claim 3, wherein said plurality of data including parity data are data based upon Reed-Solomon Code.

5. A circuit for detecting a data error, comprising:

a syndrome calculating means which receives a plurality of data including pariety data and calculates syndromes $S_0$, $S_1$, $S_2$ and $S_3$ and divides the syndromes $S_0$, $S_1$, $S_2$ and $S_3$ by 1, $\alpha$, $\alpha^2$ and $\alpha^3$, ($\alpha$ is a root of a polynomial of degree eight) to produce outputs $S_0'$, $S_1'$, $S_2'$ and $S_3'$;

a counting means for counting the number of execution times of division in the syndrome calculating means;

an adding means which receives the outputs $S_0'$, $S_1'$, $S_2'$ and $S_3'$ of the syndrome calculating means and evaluates $S_0'+S_1'$, $S_1'+S_2'$, $S_2'+S_3'$, $S_0'+S_2'$ and $S_1'+S_3'$;

an error zero detecting means which detects that all of the syndromes $S_0$, $S_1$, $S_2$ and $S_3$ are "0" based upon outputs of the syndrome calculating means;

a single error detecting means which detects $S_0'=S_1'=S_2'=S_3'=0$;

a multiplying means which receives the output of the adding means and evaluates $(S_0'+S_1')(S_2'+S_3')$, $(S_1'+S_2')^2$, $(S_0'+S_2')(S_2'+S_3')$ and $(S_1'+S_2')(S_1'+S_3')$;

a double error detecting means which determines whether or not equations $(S_0'+S_1')(S_2'+S_3')=(S_1'+S_2')^2$ and $(S_0'+S_2')(S_2'+S_3')=(S_1'+S_2')(S_1'+S_3')$ can be formed based upon outputs of the multiplying means;

a first holding means which holds a counted value j of the counting means based upon a detection output of the single error detecting means and a first detection output of the double error detecting means; and a second holding means which holds a counted value i of the counting means based upon a second detection output of the double error detecting means.

6. A circuit for detecting a data error, comprising:

a syndrome calculating means which receives a plurality of data including parity data and calculates syndromes $S_0$, $S_1$, $S_2$ and $S_3$ and divides the syndrome $S_0$, $S_1$, $S_2$ and $S_3$ by 1, $\alpha$, $\alpha^2$ and $\alpha^3$ ($\alpha$ is a root of a polynomial of degree eight) to produce outputs $S_0'$, $S_1'$, $S_2'$ and $S_3'$;

a counting means for counting the number of execution times of division in the syndrome calculating means;

an adding means which receives the outputs $S_0'$, $S_1'$, $S_2'$ and $S_3'$ of the syndrome calculating means and evaluates $S_0'+S_1'$, $S_1'+S_2'$, $S_2'+S_3'$, $S_0'+S_2'$ and $S_1'+S_3'$;

an error zero detecting means which detects that all of the syndromes $S_0$, $S_1$, $S_2$ and $S_3$ are "0" based upon outputs of the syndrome calculating means;

a single error detecting means which detects $S_0'=S_1'=S_2'=S_3'\neq 0$;

a multiplying means which receives the output of the adding means and evaluates $(S_0'+S_1')(S_2'+S_3')$, $(S_1'+S_2')^2$, $(S_0'+S_2')(S_2'+S_3')$ and $(S_1'+S_2')(S_2'+S_3')$;

a double error detecting means which determines whether or not equations $(S_0'+S_1')(S_2'+S_3')=(S_1'+S_2')^2$ and $(S_0'+S_2')(S_2'+S_3')=(S_1'+S_2')(S_1'+S_3')$ can be formed based upon outputs of the multiplying means;

a first holding means which holds a counted value j of the counting means based upon a detection output of the single error detecting means and a first detection output of the double error detecting means;

a second holding means which holds a counted value i of the counting means based upon a second detection output of the double error detecting means;

an i-j calculating means which evaluates difference of the counted values i and j;

an $S_0'+S_1'$ holding means which holes an output $S_0'+S_1'$ of the adding means based upon a first detection output of the double error detecting means; and an error component calculating means which calculates error component $(S_0'+S_1')/(1+\alpha^{j-i})$ based upon an output $S_0'+S_1'$ of the $S_0'+S_1'$ holding means and an output i-j of the i-j calculating means.

7. A circuit for detecting a data error, comprising:

a syndrome calculating means which receives a plurality of data including parity data and calculates syndromes $S_0$, $S_1$, $S_2$ and $S_3$ and divides the syndromes $S_0$, $S_1$, $S_2$ and $S_3$ by 1, $\alpha$, $\alpha^2$ and $\alpha^3$ ($\alpha$ is a root of a polynomial of degree eight) to produce outputs $S_0'$, $S_1'$, $S_2'$ and $S_3'$;

a first adding means which receives the outputs $S_1'$ and $S_2'$ and provides $S_1'+S_2'$;

a first selecting means which receives the outputs $S_2'$ and $S_3'$ and selects any one of the output $S_2'$ and $S_3'$;

a second adding means which receives the output $S_1'$ and an output of the first selecting means and provides $S_1'+S_2'$ or $S_1'+S_3'$;

a third adding means which receives the outputs $S_2'$ and $S_3'$ and forms outputs $S_2'+S_3'$;

a second selecting means which receives the outputs $S_1'$ and $S_2'$ and selects any one of the outputs $S_1'$, and $S_2'$;

a fourth adding means which receives the output $S_0'$ and an output of the second selecting means and forms outputs $S_0'+S_1'$ or $S_0'+S_2$;

a first multiplying means which receives outputs of the third and fourth adding means and outputs $(S_1'+S_2')^2$ or $(S_0'+S_1')(S_2'+S_3')$;

a second multiplying means which receives outputs of the third and fourth adding means and outputs $(S_0'+S_1')(S_2'+S_3')$ or $(S_0'+S_2')(S_2'+S_3')$; and a double error detecting means which receives outputs of the first and second multiplying means and detects that one of two equations $(S_0'+S_1')(S_2'+S_3')=(S_1'+S_2')^2$ and $(S_0'+S_2')(S_2'+S_3')=(S_1'+S_2')(S_1'+S_3')$ is formed by controlling the first and second means in response to a detection output at a timing when the other of the two equations is formed.

* * * * *